United States Patent [19]

Reisfeld et al.

[11] Patent Number: 4,661,649
[45] Date of Patent: Apr. 28, 1987

[54] SOLAR CONCENTRATOR PLATES

[75] Inventors: Renata Reisfeld; Rivka Zusman, both of Jerusalem, Israel

[73] Assignee: Yissum Research Development Company of the Hebrew University of Jerusalem, Jerusalem, Israel

[21] Appl. No.: 773,357

[22] Filed: Sep. 6, 1985

[30] Foreign Application Priority Data

Sep. 6, 1984 [IL] Israel ......................... 72885

[51] Int. Cl.$^4$ ...................... H01L 31/04; H01L 25/02; G02B 5/14
[52] U.S. Cl. ..................... 136/247; 250/227; 250/484.1; 250/486.1; 350/96.10
[58] Field of Search ....................... 136/247, 257, 259; 250/227, 484.1, 486.1, 488.1; 350/96.10

[56] References Cited

U.S. PATENT DOCUMENTS 4,452,720 6/1984 Harada et al. .................. 252/301.16

OTHER PUBLICATIONS

R. Reisfeld et al, *Nature*, vol. 274, pp. 144-145 (Jul. 13, 1978).
R. Reisfeld et al, *Nature*, vol. 283, pp. 281-282 (Jan. 17, 1980).
R. Reisfeld et al, *Structure and Bonding*, vol. 49, pp. 1-36 (1982).
A. Kisilev et al, *Solar Energy*, vol. 33, pp. 163-169 (1984).
R. Reisfeld et al, *Proceedings, 3rd Int'l Conf. on Photochemical Conversion and Storage of Solar Energy*, Colorado, Aug. 1980, pp. 95-97.
A. Kisilev et al, *Proceedings, 4th Int'l Conf. on Photochemical Conversion & Storage of Solar Energy*, Jerusalem, Aug. 1982, Abstracts, pp. 299-301.
R. Reisfeld et al, *Solar Energy Mat'ls*, vol. 8, pp. 399-409 (1983).
A. Zastrow et al, *Proceedings, 3rd E. C. Photovoltaic Solar Energy Conf.* (1980), Reidel Pub. Co. (1981), pp. 413-417.
H. Blumenfeld et al, *Solar Cells*, vol. 7, pp. 311-325 (1982).

*Primary Examiner*—Aaron Weisstuch
*Attorney, Agent, or Firm*—Norbert P. Holler

[57] ABSTRACT

The invention provides a solar concentrator plate doped with a dye selected from the group consisting of GF Orange-Red, Fluorol 555, oxazine-4-perchlorate, LDS 730, LDS 750, BASF 241, BASF 339, and combinations thereof with each other or with GF Clear with 3-phenyl-fluoranthene.

10 Claims, 10 Drawing Figures

ABSORPTION AND EMISSION SPECTRA OF PMMA
COATED BY FLUOROL-555

Fig. 7.

ABSORPTION SPECTRA OF PMMA COATED BY CLEAR, FLUOROL, ORANGE RED

Fig. 8.

EMISSION SPECTRA OF PMMA COATED BY CLEAR, FLUOROL, ORANGE RED

SOLAR CONCENTRATOR PLATES

The present invention relates to solar concentrator plates. More particularly, the present invention relates to solar concentrator plates having high efficiency and stability and to luminescent solar concentrators containing such plates.

As is known, the use of solar energy as a power source is not yet cost competitive with other power generating methods because of the high cost of solar cells and tracking solar energy concentrators. In an attempt to lower cost by reducing the cell area during the last years much work has been based on the concept of a luminescent solar concentrator which can absorb solar light from a large insolated area and concentrate the emitted fluorescent light to a small area to which photovoltaic cells can be attached. Luminescent solar concentrators (LSC) are based on the entrance of solar radiation into a homogeneous medium collector containing a fluorescent species in which the emission bands have little or no overlap with the absorption bands. This emission is trapped by total internal reflection and concentrated at the edge of the collector by the geometrical shape which is usually a thin plate. Thus the concentration of light trapped in the plate is proportional to the ratio of the surface area to the edges. The advantages of LSC over conventional solar concentrators are the following:

(a) High collection efficiency of solar light direct and diffuse;
(b) Good heat dissipation from the large area of the collector plate in contact with air, so that essentially "cold light" is used for converter devices such as silicon cells, whose efficiency is reduced by high temperatures;
(c) tracking of the sun is unnecessary; and
(d) Choice of the luminescent species allows optimal spectral matching of the concentrated light to the maximum sensitivity of the photovoltaic (PV) process, minimizing undesirable side reactions in the PV cells.

Two types of homogeneous media have been proposed so far as substrates for the fluorescent species, glass [see, e.g., Israel Pat. No. 56,742 corres. to U.S. Pat. No. 4,367,367 and U.K. Pat. No. 2,028,859; R. Reisfeld and S. Neuman, "Planar solar energy convertor and concentrator based on uranyl doped glass," Nature 274 (1978) 144–145; R. Reisfeld and Y. Kalisky, "Improved planar solar convertor based on uranyl neodymium and holmium glasses," Nature 283 (1980) 281–282; R. Reisfeld and C. K. Jorgensen, "Luminescent solar concentrators for energy conversion", Structure and Bonding 49 (1982) 1–36; A. Kisilev and R. Reisfeld, "Spectral characteristics and fluorescence quantum efficiencies of Cr (III) in phosphate and silicate glasses with Li and Be modifiers." Solar Energy 33 (1984) 163–169; R. Reisfeld, E. Greenberg, A. Kisilev and Y. Kalisky, "Collection and conversion of solar energy for photoconversion systems," Third Int'l. Conference on Photochemical Conversion and Storage of Solar Energy, Colorado, August, 1980; "Photochemical Conversion and Storage of Solar Energy," Ed. J. S. Connolly, Academic Press (1981) 364; and A. Kisilev, R. Reisfeld and H. Tzehoval, "Manganese and chromium doped phosphate and silicate glass for fluorescent concentrators," Fourth Int'l. conference on Photochemical Conversion and Storage of Solar Energy, Jerusalem, August 1982, Book of Abstracts, p. 299–301], and organic plastic materials in which the fluorescent species are incorporated into the bulk of the host [see, e.g., J. S. Batchelder, A. H. Zewail and T. Cole, Appl. Opt. 18 (1979) 3090; A. Goetzberger and V. Wittwer, Solar Cells, 4 (1981) 3; and J. M. Drake, M. L. Lesiecki, J. Sansregret and W. R. L. Thomas, Appl. Opt. 21 (1982) 2945].

Recently published articles have also proposed a concept of light concentration in which a thin film of dye is deposited on a glass [see, e.g., P. S. Friedman, Opt. Eng. 20 (1981) 887; C. F. Rapp and N. L. Boling, Proc. 13th IEEE Photovoltaics Specialists, and the above-cited article by R. Reisfeld and C. K. Jorgensen in Structure and Bonding 49 (1982), at p. 32].

In such a configuration a fluorescent dye dispersed in PMMA or in a related transparent polymer is brought into optical contact with the glass. Fluorescence emitted from the dye is trapped in the combined system and emitted in a concentrated form from the edges. In order that the trapping be efficient in the composite configuration the refractive index of the film should be either slightly less or the same as that of the substrate.

In addition, quite recently, porous fluorescent materials have been suggested for LSC by R. Reisfeld, N. Manor and D. Avnir, "Solar Energy Materials" 8 (1983) 399–409.

In recent years many articles and patents have dealt with solar concentrators [see, e.g., W. H. Weber and John Lambe, Appl. Opt. 15 (1976) 2299–2230; A. Goetzberger and W. Greubel, Appl. Phy. 14 (1977) 123–139; and U.S. Pat. Nos. 4,110,123; 4,140,544; 4,144,097; 4,159,212; 4,173,495; 4,188,238 and 4,367,367].

As is known, the performance of LSC is given by the effective concentration ratio which is the product of the geometrical factor and the optical conversion efficiency of the collector. The geometrical factor is the ratio of the surface Area $A_s$ to the area of the plate edges $A_l$. The optical conversion efficiency $\eta_{opt}$ of the collector plate may be defined as the ratio of light delivered from the total edges to the light incident on the collector plate.

$$\eta_{opt} = p_{out}/p_{in} \tag{1}$$

where $p_{in}$ is the total solar power in watts incident on the collector and $p_{out}$ is the power delivered from the total edges.

The optical conversion plate efficiency depends on the following factors:

1. The fraction of the light absorbed $\eta_{abs}$;
2. Quantum efficiency of the fluorescent species $\eta_f$;
3. Stokes efficiency $\eta_s$, which is the ratio between the average energy of emitted photons to the average energy of adsorbed photons $$\eta_s = \nu_{emis}/\nu_{abs};$$

4. The fraction of the light trapped in the collector $\eta_t$;
5. Transport efficiency $\eta_{tr}$, taking into account transport losses due to matrix absorption and scattering; and
6. Parasitic efficiency $\eta_{sel}$, taking into accoutn parasitic losses due to self-absorption of the colorants.

Factors 4 and 5 depend on the host material of the collector. Factors 1, 2, 3, and 6 depend on the nature of the absorbing and fluorescent species such as the transition probability for absorption, width of the spectral bands, energy transfer efficiencies from the donor to the acceptor molecules, and non-radiative transfer probabilities of the fluorescent species.

The first four parameters were studied and determined for purposes of the present invention for inorganic glasses doped with fluorescent ions and for thin films of dyes deposited on glasses and plastics.

The expression for the optical conversion efficiency including reflection is given by $$\eta_{opt} = (1-R)\eta_{abs}\eta_f\eta_s\eta_f\eta_{tr}\eta_{sel} \qquad (2)$$

where $\eta_f = 1 - \sqrt{1/n^2}$ (n=refractive index), $\eta_{sel}$ includes losses due to absorption of luminescent light by the colorant, $\eta_{tr}$ scattering losses due to glass imperfections and R=Fresnel reflection coefficient (approx.=4%).

The current gain $G_i$ is the ratio of the electrical current delivered from the PV cell complex to the edge of the LSC relative to the current obtained from the identical cell when both are turned perpendicular to the solar radiation. Since the current is proportional to the energy output its gain is important in the economical evaluation of a collector.

In these studies it was noted that the self-absorption is low in the inorganic material, especially when the absorption and emission arises from different electronic levels in the same ion or the absorption and emission originate from different species which transfer energy between them. It may be quite appreciable in organic dyes which have overlapping absorption and emission spectra when the dyes are homogeneously dispersed in a plastic or liquid solvent. This may decrease significantly the optical plate efficiency of the collector based on organic dyestuffs in homogeneous media. The self-absorption is reduced in the thin-film configuration where the emitted luminescence travels in an optically transparent medium. Self-absorption can also be diminished to some extent by utilizing energy transfer from an acceptor molecule to the donor molecule, thus separating the absorption and emission bands.

As can be seen from the above-mentioned patents and publications, so far mostly laser dyes have been used as fluorescent molecules in LSC. These molecules usually have good quantum efficiencies; however their disadvantage is their photoinstability.

Since the photo-stability of dyes for LSC is of vital importance for the long range performance of LSC it is an object of the present invention to provide solar concentrator plates and LSC based thereon having much greater stability than those previously suggested in the prior art.

It has now been found, however, that dyes such as Coumarin 153(R), Coumarin 311(R), Rhodamine 6G(R) and Sulfarhodamine B(R) described in the prior art as being preferred for the presently proposed uses (the symbol "(R)" identifies the dyes as "radiant") in fact are bleached in sunlight within 2-3 days and thus do not possess the necessary photostability for use in solar concentrator plates and LSC.

Similarly, of the hundreds of dyes available on the market most of those tested exhibited similar lack of photostability.

Thus it was surprising to find that Horn Radglo fluorescent pigments GF Orange-Red(R) and GF Clear(R) available commercially from Ciba-Geigy-Ten-Horn-Pigment Chemie N. V. Holland, Fluorol 555(R), LDS 730(R) and LDS 750(R) available from Exciton Chemical Co. Inc., Dayton, Ohio, laser grade Oxazine-4-perchlorate available from Eastman Kodak Co., and BASF 241, BASF 339, and 3-Phenyl Fluoranthene all possess both the necessary photostability and concentrator plate efficiency which have long been sought and heretofore not exhibited by most dyes.

Thus, e.g., plates covered with Orange-Red, Clear, Fluorol and Oxazine-4-perchlorate have been placed in indirect and direct sunlight passing through a glass for periods in excess of two years without any appreciable changes in absorption and emission characteristics, and the remaining dyes according to the present invention also possess superior stability characteristics when compared with the above-mentioned prior art dyes.

It has also now been found that the photo-stability of the dye in the thin film configuration is greatly enhanced when the dye is covered by a thin film of inorganic glass doped by cerium (III), or alternatively, if the organic dye is added to the glass-forming mixture which is then deposited as a thin film on a PMMA substrate.

Thus according to the present invention there is now provided a solar concentrator plate doped with a dye selected from the group consisting of Orange-Red, Fluorol$^{555}$, Oxazine-4 perchlorate, LDS 730, LDS 750, BASF 241, BASF 339 and combinations thereof with each other or with Clear or with 3-phenyl-fluoranthene.

Similarly, the present invention is directed to all dyes having different commercial names but nevertheless having the same dye pigment identifiable by the data set forth in Table II hereinafter.

The present invention also provides a luminescent solar collector for high efficiency conversion of solar energy to electrical energy wherein solar energy is converted to fluorescent radiation at longer wave lengths at which photovolatic cells have a better efficiency, the LSC comprising a solar concentrator plate according to the present invention, said plate being provided with a photovoltaic cell at at least one of its lateral edges, said photovoltaic cell having a high efficiency in the region of the spectrum of the respective fluorescent radiation.

In the preferred embodiments of the present invention the dye or combination of dyes is dispersed in a thin film of glass or plastic material covering said plate; however other embodiments wherein said dye is incorporated in a plastic or glass plate are also included herein.

The dye film can then be covered by a glass film including cerium (III), or without cerium (III), which is polymerized on the plate.

Especially preferred embodiments are those wherein said plate is doped:

(a) with BASF 241+BASF 339+Clear
(b) with BASF 241+BASF339
(c) with BASF 339+Clear
(d) with a combination of Orange-Red and Clear dyes;
(e) with a combination of Orange-Red and Fluorol dyes;
(f) with a combination of Orange-Red and oxazine-4-perchlorate dyes;
(g) with a combination of Orange-Red and LDS 730;
(h) with a combination of Orange-Red and LDS 750; or
(l) with one of Orange-Red, Fluorol, or LDS 730 dyes alone.

The invention will now be described in connection with certain preferred embodiments with reference to the following illustrative figures and examples so that it may be more fully understood.

It will be understood however that it is not intended to limit the invention to these particular embodiments. On the contrary, it is intended to cover all alternatives, modifications and equivalents as may be included within the scope of the invention as defined by the appended claims. Thus, the following examples which include preferred embodiments will serve to illustrate the practice of this invention, it being understood that the particulars shown are by way of example and for purposes of illustrative discussion of preferred embodiments of the present invention only and are presented in the cause of providing what is believed to be the most useful and readily understood description of formulation procedures as well as of the principles and conceptual aspects of the invention.

EXAMPLES

General Procedure

For preliminary investigations the dyes were dissolved in chloroform or 1,2-dichloroethane, analytical grade. For coating glass or plastic substances with the chosen dyes, a solution of PMMA (Matheson, Coleman & Bell) in dichloroethane was prepared. The optimal PMMA concentration of 100 gm/l was determined by repeated experimentation with glass substrates. The dyes were dissolved in this stock solution.

Glass microscope slides 25 mm × 75 mm × 1 mm and PMMA plates 10 × 10 cm × 0.3 cm were used as substrates. These were heated to 42 ± 2° C. prior to dipping in the dye solution at the same temperature, and then dried for 3 hours. Precautions were taken to eliminate interfering substances throughout the process.

The coloured slides were dipped in a solution having the following materials:

10 ml tetramethylorthosilicate (tetramethoxysilan)
10 ml boric acid (5.5 gm in 100 ml alcohol)
5 ml aluminum ethoxide in dichloroethane
5 ml potassium ethoxide in dichloroethane
1 ml 1% ethanol solution of cerium chloride
5 ml methylamine (33% $CH_3NH_2$ in ethanol)
1.3 ml polyethylene glycol-400-monooleate (emulsifier) made up to 100 ml with dichloroethane.

The temperature of this solution and environment was 40° C. After dipping, the thin layer of tetramethoxysilane was transformed by polymerization into a glass film covering the coloured slide.

Similar coating techniques can be also found in H. Dislich, J. Noncrystalline Solids 57 (1983) 371 and H. Dislich and E. Hussmann, "Thin solid Films" 77 (1981) 129.

In order to achieve as uniform films as possible, an arrangement for coating the substrates was set up which consists of a glass container for holding the PMMA-dye solution, a motor driven spindle and a wire windable and unwindable around said spindle. Said wire passes over a pulley wheel positioned over said container and is inserted through holes provided at one edge of the plate to be immersed. The time of dipping is then uniformly controlled by the velocity of the motor immersing and pulling out said plates.

For coating substrates with the chosen dyes a solution of PMMA (Matheson, Coleman and Bell) in dichloroethane was prepared. The optimal PMMA concentration of 100 gm/l was determined by repeated experimentation. The dyes were dissolved in this stock solution. The optimal concentrations of the chosen dyes were:

| | | |
|---|---|---|
| Clear | (Ciba-Geigy-Ten-Horn textile dye) | 200 g/l |
| Orange-Red | (Ciba-Geigy-Ten-Horn textile dye) | 20 g/l |
| Fluorol 555 | (Exciton laser grade dye) | 0.65 g/l |
| LDS 730 | (Exciton laser grade dye) | 0.2 g/l |
| LDS 750 | (Exciton laser grade dye) | 0.2 g/l |
| BASF 241 | | 5.0 g/l |
| BASF 339 | | 2.0 g/l |
| 3-Phenyl Fluoranthene | | 5.0 g/l |

Absorption spectra were taken on a Cary-14 spectrophotometer using identical substrate glasses as blanks. Emission and excitation spectra were measured at room temperature on a spectrofluorimeter using a 500 W Xenon dc source, two Bausch & Lomb monochromators and an EMI 9558 photomultiplier connected through a Vibron amplifier to a Kipp and Zonen strip chart recorder. Sample excitation was through the plate face and the spectra presented here were obtained from the plate edge approximately 10 mm away from the excitation area.

The fraction of solar light absorbed ($\eta_{abs}$) was measured using a broad band radiometer (Ophir Optics). The measured transmission of each sample was divided by the measured transmission of a glass blank. Thus the result is corrected for surface reflection losses. The experimental error is ±5%.

Refractive indices of the dye lasers were measured by the Brewster angle method and with the sodium D-line. The experimental error is less than ±1%. Table 1 gives the measured refractive indices and calculated fraction of light trapped for Orange-Red, Clear and a combination of Orange-Red and Clear.

Examples 1–3

TABLE I

MEASURED REFRACTIVE INDICES AND CALCULATED TRAPPING EFFICIENCIES

| Dye | Refractive Index | Trapping Efficiency $\eta_t$ | Optical Density at Peak Maximum |
|---|---|---|---|
| OR | 1.507 | 0.75 | 0.99 |
| Cl | 1.595 | 0.78 | 1.00 |
| OR + Cl | 1.591 | 0.78 | 1.00 |

OR = Orange Red
Cl = Clear

Example 4

In order to increase the solar absorption, LSC plates coated by more than one dye were constructed in a multilayered film LSC. The order of coating dyes was chosen such that the shortest wavelength absorbing dye was followed by the next shortest wavelength dye and the outside layer contained the longest wavelength dye: e.g., Clear-Fluorol-Orange/Red. Finally the plate was covered by a thin film of glass containing 0.1% $Ce^{3+}$ forming a plate with the following sequential layers:

Glass + $Ce^{3+}$, Orange-Red, Fluorol-555, Clear, undoped substrate, Clear, Fluorol-555, Orange-Red, Glass + $Ce^{3+}$.

Example 5

The polymer or glass plate was coated on one side with BASF 241 and on top of this another layer containing BASF 339 was deposited. This was finally covered with glass containing $Ce^{3+}$ by the deposition of tetramethoxysilane containing $Ce^{3+}$. On the second side Clear was deposited and covered by a $Ce^{3+}$-containing glass layer.

Quantum efficiency was calculated using the comparison with standard material method (as reported in Israel J. Chem. 7 (1969) 613, and R. Reisfeld, J. Res. Nat. Bur. Standards, 76A (1972) 613).

The following equation was used:

$$\eta_u = \eta_s \frac{F_u \cdot A_s \cdot I_{\lambda sEX}}{F_s \cdot A_u \cdot I_{\lambda uEX}} \cdot \frac{n_u^2}{n_s^2}$$

where $\eta_u$ and $\eta_s$ are quantum yields of the unknown and standard respectively, $n_u$ and $n_s$ are indices of refraction, A is the absorbance at the wavelength of excitation, F is the integrated area under the emission spectrum, and $I_{\lambda Ex}$ is the relative irradiance of the light at the wavelength of excitation.

Eu (III) in germanate glass excited at 453 nm was used as a standard. Quantum yield of Eu (III) at 458 nm excitation is equal to 0.75. Refractive index of germanate glass was taken as $\eta_D = 1.64$ (refractive indices of phosphate and silicate glasses are 1.51).

For LSC evaluation the samples were placed on an apparatus constructed for this purpose which enables alignment of the glass and reference cell relative to the sun. OCLI photovoltaic cells of dimensions 20 mm × 4 mm with antireflective coating were apertured down to expose a 1 mm strip. Alternatively, silicon amorphous cells provided by Dr. G. A. Swartz of RCA were used. One cell was used as reference with its plane parallel to the glass face. Another identical cell was placed in optical contact with the glass edge using parafin oil for index matching. The short circuit current was measured with a Tabor Electronics digital multimeter 608B. Care was taken to shade the measuring cell from direct sunlight so that cell current without sample was less than 4% of reference current.

The attached drawings present the absorption spectra of the dyes on glass in which.

Figure 1:
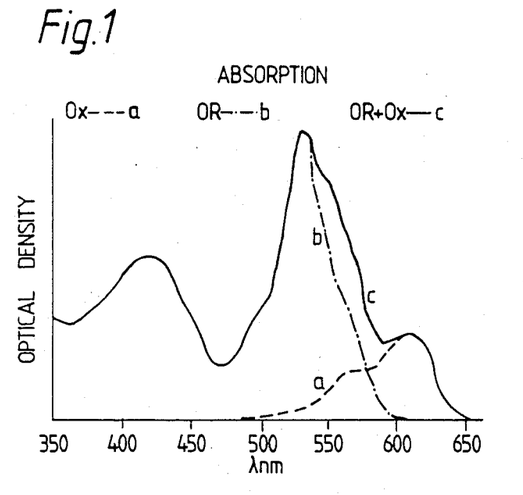
FIG. 1 presents absorption spectra of oxazine-4 alone, concentration $2 \times 10^{-4}$ mole/l; Orange Red alone, concentration 20 gm/l; and Orange Red 20 gm/l, coated over Oxazine-4, 0.01 gm/l.
Figure 2:
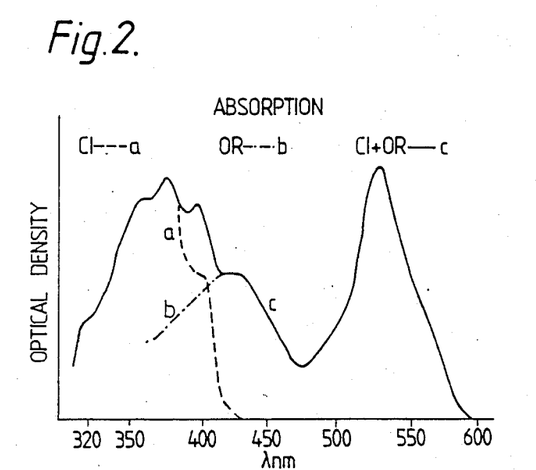
FIG. 2 presents the absorption spectra of Clear alone, concentration 200 gm/l; Orange Red alone, concentration 20 mg/l; and Orange Red, 20 gm/l, coated over Clear, 200 gm/l.
Figure 3:
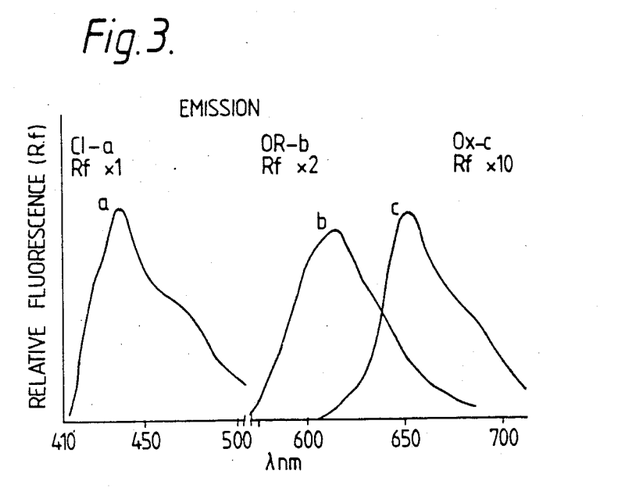
FIG. 3 shows the emission spectrum of Orange Red (excitation at 530 nm); of Oxazine-4 (excitation at 610 nm); and of Clear (excitation at 375 nm).
Figure 4:
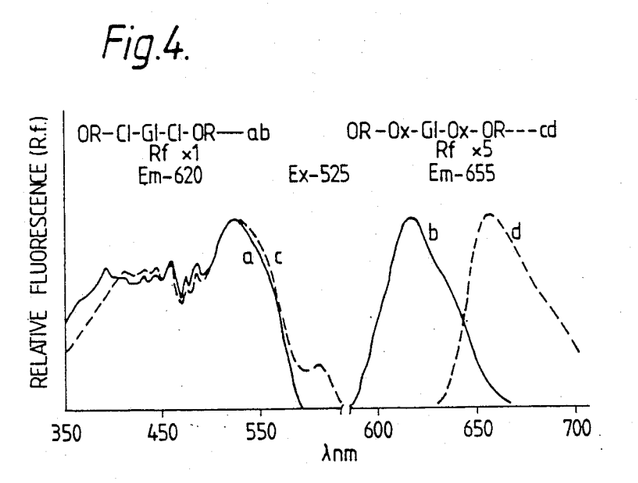
FIG. 4 gives the excitation spectrum (a) of Orange Red coated on Clear (emission at 620 nm) and the emission spectrum (b) of Orange Red coated over Clear (excitation at 530 nm); the excitation spectrum (c) of Orange Red coated over Oxazine-4 (emission at 655 nm) and the emission spectrum (d) of Orange Red coated over Oxazine-4 (excitation at 530 nm).
Figure 5:
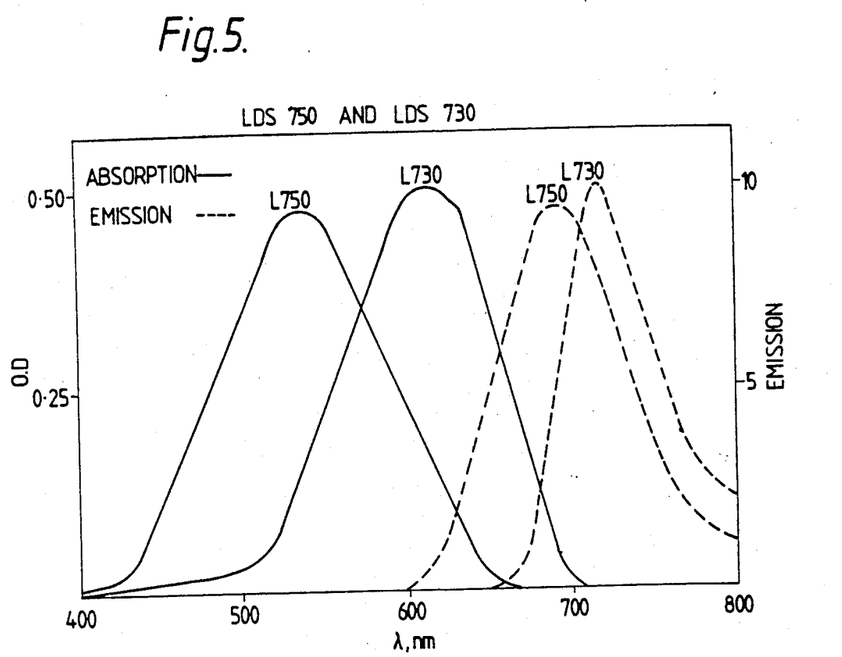
FIG. 5 gives the absorption and emission spectra of LDS 750 and LDS 730.
Figure 6:
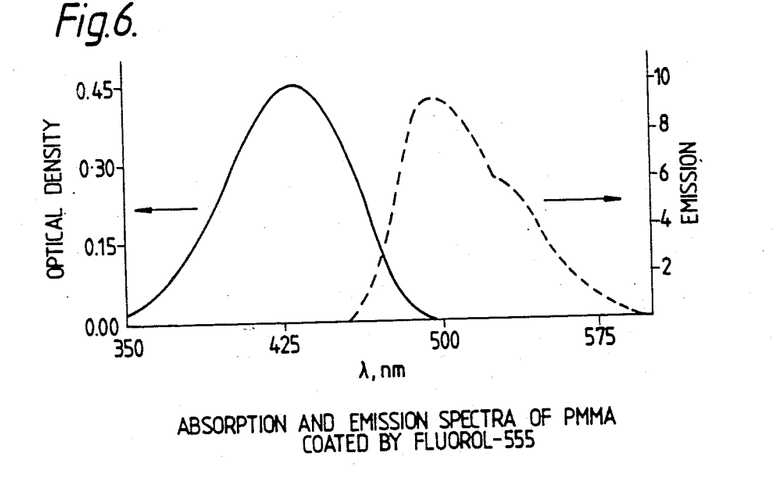
FIG. 6 presents the absorption and emission spectra of PMMA coated by Fluorol-555.
Figure 7:
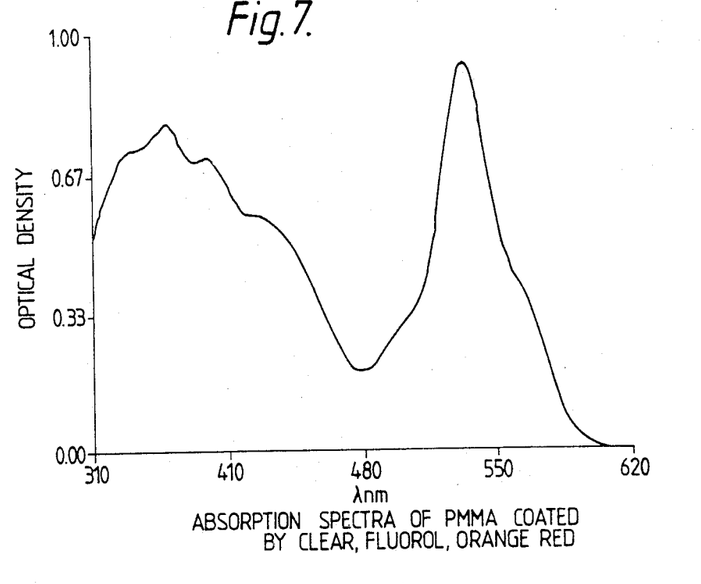
FIG. 7 presents the absorption spectra of PMMA coated by Clear, Fluorol, and Orange Red as in Example 1.
Figure 8:
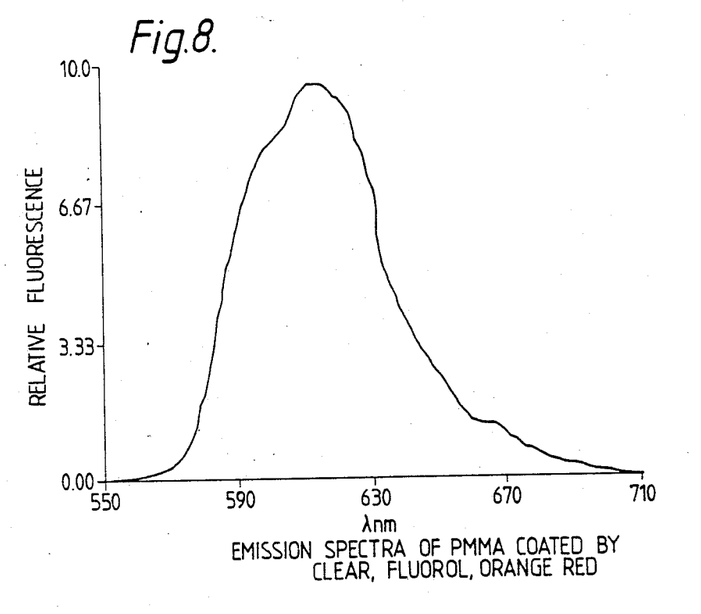
FIG. 8 presents the emission spectra of PMMA coated by Clear, Fluorol, and Orange Red as in Example 1.
Figure 9:
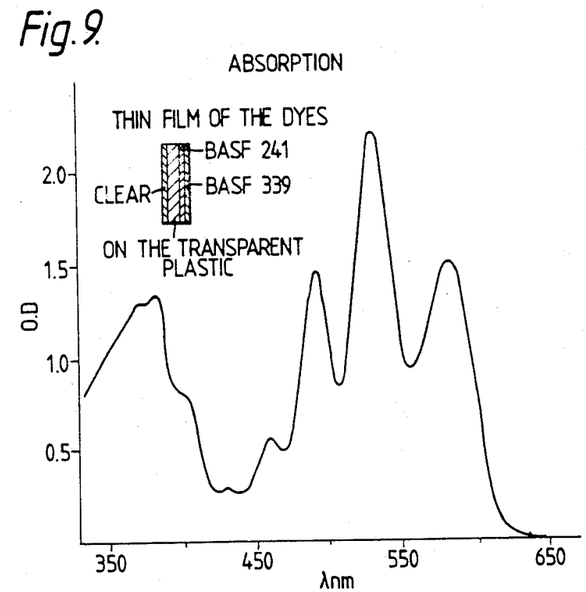
FIG. 9 presents the absorption spectrum of PMMA coated by Clear, BASF 241, and BASF 339.
Figure 10:
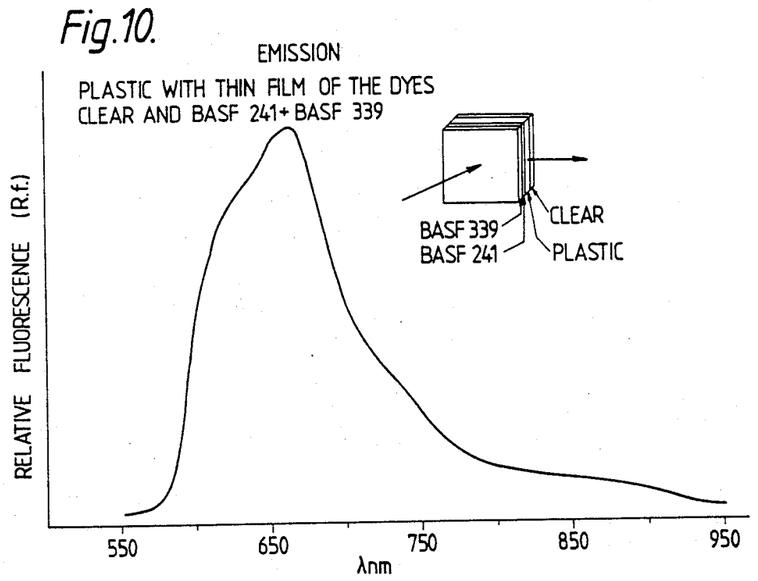
FIG. 10 presents the emission spectrum of PMMA coated by Clear, BASF 241, and BASF 339.

All concentrations in the figures are in starting solution, PMMA concentration 100 gm/l in dichloroethane. The dye optimum concentrations were chosen as those having maximum quantum efficiency.

It should be noted that the sensitivities corresponding to the curves in each of the figures vary by factors of up to 10; thus Clear has the highest, and Oxazine-4 the lowest emission intensity in the figures.

Optical efficiencies of sample plates as set forth in the tables hereinafter were measured outdoors and behind a glass window using an adjustable positioning table specially constructed to enable alignment of a sample and reference cell relative to the sun and dimensions of the samples. Single crystal silicon photovoltaic cells were used. One cell was used as reference with its plane parallel to the sample face. Another identical cell was placed in optical contact to the sample edge using paraffin oil for index matching. The short circuit current was measured with a Tabor Electronics digital multimeter 608B.

Referring now to Table II, there are provided the characterizing absorption and emission maxima, quantum efficiency and Stokes shift for various dyes used in the present invention when coated on glass or on polymeric transparent material such as PMMA.

TABLE II

ABSORPTION AND EMISSION MAXIMA, QUANTUM EFFICIENCY AND STOKES SHIFT FOR VARIOUS COATED GLASSES

| Dye | | Peak Absorption $\lambda_{max}$ nm | Peak Emission $\lambda_f$ nm | $\eta_1$ % | Stokes Shift $cm^{-1}$ |
|---|---|---|---|---|---|
| OR | Thin film on glass | 530 | 620 | 78.5 | 2736 |
| Cl | Thin film on glass | 375 | 440 | ~90.0 | 3939 |
| Fl | Thin film on glass | 440 | 495 | 88.0 | 2525 |
| LDS-730 | Thin film on glass | 620 | 700 | ~30.0 | 1844 |
| LDS-750 | Thin film on glass | 550 | 685 | ~20.0 | 3583 |
| OX | Thin film on glass | 610 | 655 | 36.6 | 1126 |
| OX | in methanol | 609 | 646 | 63.0 | 941 |
| OX | in ethanol 614 | 651 | 62.0 | 926 | |
| BASF 241 | Thin film | 525 | 650 | ~100 | 3663 |

TABLE II-continued

ABSORPTION AND EMISSION MAXIMA, QUANTUM EFFICIENCY
AND STOKES SHIFT FOR VARIOUS COATED GLASSES

| Dye | | Peak Absorption $\lambda_{max}$ nm | Peak Emission $\lambda_f$ nm | $\eta_1$ % | Stokes Shift cm$^{-1}$ |
|---|---|---|---|---|---|
| BASF 339 | on glass Thin film on glass | 580 | 660 | ~95 | 2090 |

OR = Orange Red
Cl = Clear
OX = Oxazine-4
Fl = Fluorol

Table III presents examples of the LSC performance characteristics of several of the coated plates. In that Table, $\eta_{opt}=G_i/G$, wherein $G_i=I_{edge}/I_{reference}$ and G = geometric factor which is 9.4.

In this table the notation dye symbol-glass means that dye was deposited on one side of glass, while the notation dye symbol-glass-dye symbol means dye was deposited on both glass sides. The dye symbol to the left of the glass symbol means that the covered side was exposed to the sun, while the glass symbol to the left of the dye symbol means that the glass side was exposed to the sun.

If two dyes are present, the order of coverage is as in the text, for example OR-OX-Gl-OX-OR means that the glass was covered on both sides, first by OX and then by OR.

As can be seen from Table III the plate efficiency of 14% is obtained when Orange Red covers a glass coated first by Clear. This arises from the fact that the escaping light from Clear is absorbed by Orange Red. The strong fluorescence of Clear having quantum efficiency of about 90% (Table II) is trapped in the Orange Red. Here we have a case of energy transfer which may be of the radiative or nonradiative type between Clear and Orange Red which is a result of the overlap of the absorption spectrum of Orange Red and the emission spectrum of Clear.

The emission of Orange Red overlaps the maximum sensitivity of gallium arsenide solar cells which have about 60% efficiency at these wavelengths; thus one can expect a collector efficiency of 7.2% for a plate coated by Clear and Orange Red and coupled to a gallium arsenide cell.

Even better efficiencies are obtained of about 35% when a combination of Orange Red and Clear or Orange Red and Fluorol cover a PMMA plate.

The best efficiencies were obtained with the combination BASF 241, BASF 339, and Clear. The values of optical efficiencies obtained when the plates were coupled to silicon cells or gallium arsenide cells are presented in Table IV. The best efficiency of 0.43 towards direct light was obtained with a combination of BASF 241, BASF 339, and Clear coupled to GaAs cells.

TABLE III

PERFORMANCE CHARACTERISTICS OF THE PLATES

| Dye | $G_i$ | $\eta_{opt}$ | |
|---|---|---|---|
| Cl-Gl | 0.187 | 0.020 | * |
| Gl-Cl | 0.173 | 0.018 | |
| Cl-Gl-Cl | 0.276 | 0.029 | |
| OR-Gl | 0.550 | 0.056 | * |
| Gl-OR | 0.530 | 0.056 | |
| OR-Gl-OR | 0.720 | 0.077 | |
| OX-Gl | 0.131 | 0.014 | * |
| Gl-OX | 0.133 | 0.014 | |
| OX—Gl-OX | 0.128 | 0.014 | |
| OR-OX—Gl | 0.182 | 0.019 | * |
| Gl-OX—OR | 0.199 | 0.021 | |
| OR-OX—Gl-OX—OR | 0.175 | 0.019 | |
| OX—OR-Gl | 0.157 | 0.017 | * |
| Gl-OR-OX | 0.177 | 0.019 | |
| OX—OR-Gl-OR-OX | 0.147 | 0.016 | |
| OR-Cl-Gl | 0.458 | 0.049 | * |
| Gl-Cl-OR | 0.480 | 0.051 | |
| OR-Cl-Gl-Cl-OR | 1.000 | 0.126 | |
| Cl-OR-Gl | 0.642 | 0.068 | * |
| Gl-OR-Cl | 0.634 | 0.067 | |
| Cl-OR-Gl-OR-Cl | 0.789 | 0.084 | |
| Cl-OR-Gl | 0.730 | 0.077 | ** |
| Gl-OR-Cl | 0.900 | 0.096 | |
| Cl-OR-Gl-OR-Cl | 0.970 | 0.103 | |
| OR-Cl-Gl-Cl-OR | 1.090 | 0.140 | |
| OR-Cl-P—Cl-OR | 1.77 | 0.354 | * |
| OR-Fl—P—Fl—OR | 1.80 | 0.360 | |

$C_i$ = current gain = $I_{edge}/I_{reference} = I_s/I_r$
G = geometrical factor = $\frac{\text{surface area of glass}}{\text{edge area}}$ = 9.4
G = geometrical factor = $\frac{\text{surface area of PMMA}}{\text{edge area}}$ = 5
Gl = glass
P = PMMA plate (10 cm × 10 cm × 0.5 cm)
* silicon cell 20 mm × 1 mm
** amorphous silicon cell 6 mm × 1 mm

TABLE IV

EXPERIMENTAL PLATE EFFICIENCIES $\eta_{opt}$ WITH DIRECT RADIATION:
PMMA PLATE HAVING DIMENSIONS 10 × 10 × 0.3 cm WITH AND WITHOUT DYE FILM.

| PMMA Plate | Dye Film(s) | Silicon Cell | | Gallium Arsenide Cell | |
|---|---|---|---|---|---|
| | | $G_i = I_s/I_r$ | $\eta_{opt} = G_i/GF$ | $G_i = I_s/I_r$ | $\eta_{opt} = G_i/GF$ |
| With dye in bulk GS 2152 | | 1.57 | 0.19 | 2.93 | 0.35 |
| With dye in bulk GS 2152 | Clear | 1.75 | 0.21 | 3.43 | 0.41 |
| Undoped | BASF 339 | 1.60 | 0.10 | 3.28 | 0.40 |
| " | BASF 339 + Clear | 1.75 | 0.21 | 2.62 | 0.32 |
| " | BASF 241 | 1.70 | 0.20 | 2.98 | 0.36 |
| " | BASF 241 + BASF 339 | 1.65 | 0.20 | 3.40 | 0.41 |
| " | BASF 241 + BASF 339 + Clear | 1.73 | 0.21 | 3.56 | 0.43 |
| " | BASF 241 + BASF 339 + 3 Phenyl Fluoranthene | 1.78 | 0.22 | 3.6 | 0.42 |

GF = 8.3

Tables IV and V give examples of calculated and experimentally found plate efficiencies of some of the solar concentrator plates of dimensions given in Table III.

Tables VI and VII present the results obtained for PMMA plates covered by thin films of Clear and Orange-Red dyes. Two different experiments were conducted on these plates:

a. Covered plates 10 cm by 10 cm and various thicknesses (Table VI).
b. Covered plates with thickness of 0.86 cm and different areas (Table VII).

TABLE V
CALCULATED AND EXPERIMENTAL PLATE EFFICIENCIES FOR THIN FILM LSC

| Dye | $\lambda_{abs}$ nm | $\lambda_{fl}$ nm | $\eta_{abs}$ | $\eta_i$ | $\eta_s$ | $\eta_t$ | $\eta_{opt}$ calc. | $G_i$ exp. |
|---|---|---|---|---|---|---|---|---|
| OR | 530 | 620 | 0.27 | 0.79 | 0.85 | 0.75 | 0.117 | 0.077 |
| Cl | 375 | 440 | 0.15 | 0.90 | 0.84 | 0.78 | 0.076 | 0.029 |
| OR + Cl | | | 0.42 | 0.6 | 0.85 | 0.78 | 0.144 | 0.140 |
| OX | 610 | 655 | 0.10 | 0.37 | 0.93 | 0.75 | 0.022 | 0.014 |
| LDS-730 | 620 | 700 | 0.20 | 0.30 | 0.89 | 0.75 | 0.035 | |
| LDS-750 | 550 | 685 | 0.10 | 0.20 | 0.80 | 0.75 | 0.010 | |
| BASF 241 | 525 | 650 | 0.39 | 1.00 | 0.81 | 0.75 | 0.20 | 0.20 |
| BASF 339 | 580 | 660 | 0.39 | 0.95 | 0.88 | 0.75 | 0.21 | 0.19 |

$\eta_{opt} = (1 - R)\eta_{abs}\eta_i \eta_s \eta_t \eta_{tr} \eta_{sel}(1 - R) = 0.96 \; \eta_{tr} \cdot \eta_{sel} = 0.90$

TABLE VI
PMMA Plates Covered with Clear + Orange-Red. Size 10 × 10 cm and Different Thicknesses

| d (cm) | GF | $G_i = \dfrac{I\,\text{sample}}{I\,\text{ref.}}$ | $\eta_{opt} = \dfrac{G_i}{GF}$ |
|---|---|---|---|
| 0.17 | 14.7 | 1.14 | 0.08 |
| 0.24 | 10.4 | 1.25 | 0.12 |
| 0.28 | 8.9 | 1.31 | 0.15 |
| 0.32 | 7.8 | 1.37 | 0.18 |
| 0.475 | 5.3 | 1.17 | 0.22 |
| 0.86 | 2.9 | 0.78 | 0.27 |
| 1.04 | 2.4 | 0.80 | 0.33 |
| 1.68 | 1.49 | 0.60 | 0.40 |

I sample = current measured from cell attached to the LSC plate, using index matching liquid
I ref. = current measured from cell directed to sun
G = geometric factor
$G = \dfrac{l^2}{4ld}$
l = edge length
d = thickness

TABLE VII
PMMA Plates Covered with Clear = Orange-Red Thickness of 0.86 cm and various sizes

| l (cm) | S (cm²) | G | $G_i = \dfrac{I\,\text{sample}}{I\,\text{ref.}}$ | $\eta_{opt} = \dfrac{G_i}{G}$ |
|---|---|---|---|---|
| 2.5 | 6.25 | 0.73 | 0.46 | 0.63 |
| 5.0 | 25.0 | 1.45 | 0.53 | 0.366 |
| 7.5 | 56.25 | 2.18 | 0.717 | 0.329 |
| 10.0 | 100.0 | 2.91 | 0.783 | 0.269 |
| 15.0 | 225.0 | 4.36 | 0.94 | 0.216 |
| 20.0 | 400.0 | 5.81 | 0.93 | 0.160 |
| 25.0 | 750.0 | 7.27 | 1.2 | 0.165 |
| 30.0 | 900.0 | 8.72 | 1.38 | 0.158 |

The general procedure as hereinbefore set forth was repeated, however, in place of glass microscope slides there were used commercially available square PMMA plates of dimensions 10×10×0.3 cm thickness, in which dyes obtained from Rohm and Haas were dispersed throughout the entire bulk. The commercial names of the doped plates are:

| | | |
|---|---|---|
| a. | GS 740 | Green |
| b. | GS 2151 | Yellow chartreuse |
| c. | GS 323 | Orange |
| d. | GS 520 | Red |
| e. | GS 2152 | Magenta |

The results for Magenta are set forth in Table VIII.

TABLE VIII
COLORED COMMERCIAL PLATES HAVING DIMENSIONS 10 × 10 × 0.3 cm AND A GF OF 8.33 WITH AND WITHOUT FURTHER DYE COVERING

| PMMA plate 10 × 10 × 0.3 cm with dye | Dye film | Direct Radiation (South) | | Indirect Radiation (South) | | Direct Radiation through clear Glass Window (South) | |
|---|---|---|---|---|---|---|---|
| | | $G_i = I/I_{ref}$ | $\eta_{opt} = G_i/G$ | $G_i = I/I_{ref}$ | $\eta_{opt} = G_i/G$ | $G_i = I/I_{ref}$ | $\eta_{opt} = G_i/G$ |
| GS 2152 | | 1.4 | 0.17 | 1.96 | 0.24 | 2.1 | 0.25 |
| GS 2152 + | clear | 1.7 | 0.20 | 2.1 | 0.25 | 2.14 | 0.26 |
| GS 2152 + | fluorol | 1.75 | 0.21 | 2.2 | 0.27 | 2.17 | 0.26 |

| PMMA plate 10 × 10 × 0.3 cm with dye | Dye film | Radiation through Glass Window (North) | | Radiation through Glass Window (South) | (Rainy Day) |
|---|---|---|---|---|---|
| | | $G_i = I/I_o$ | $\eta_{opt} = i/G$ | $G_i = I/I_o$ | $\eta_{opt} = G_i/G$ |
| GS 2152 | | 4.4 | 0.53 | 2.69 | 0.32 |
| GS 2152 + | clear | 4.8 | 0.58 | 2.67 | 0.32 |
| GS 2152 + | fluorol | 5.2 | 0.63 | 2.4 | 0.29 |

From Tables IV and VIII it can be seen that the addition of dyes according to the present invention to commercially available fluorescent plates results in increased plate efficiency.

It is to be recognized that the plate efficiencies measured and recorded herein are the result of preliminary laboratory tests and may not represent the actual efficiencies which can be obtained when the process of thin film coating is optimized for commercial production, e.g., by centrifuging and controlled heating.

Similarly, a more effective optical coupling between the solar cells and the plate edges, e.g., through use of refractive index matching will also result in greater efficiencies.

An additional way of increasing the efficiencies of plates according to the present invention is envisioned as being achieved by optimal positioning of the plates in conjunction to highly diffusing surfaces in a manner known per se in the art [see, e.g., G. Lifante et al, "Luminescent Solar Concentrators as Bifacial Captor, Solar Cells, 8 (1983) 355–360].

Use of gallium arsenide cells instead of silicon cells also improves efficiency.

A model house having dimensions 60×60×60 cm was prepared with panels according to the present invention. The panels covering the roof, which is declined at 45°, are of size 10×10 cm and coated with BASF-241, BASF-339 and Clear on silica glass doped by Ce(III). Total area of roof is 3600 cm².

Under illumination of 1000 watt/cm² such a house provides electricity of 15 watts which operates appliances in the model house and can be stored in a storage battery.

From the above experiments it can be extrapolated that panels of 1m² will provide electricity of 40 watts, which means that a roof covered by 25 m² of panels will provide 1 K watt electricity under illumination of 1000 W/m² solar illumination at peak irradiation.

It will be further evident to those skilled in the art that the invention is not limited to the details of the foregoing illustrative embodiments and examples and that the present invention may be embodied in other specific forms without departing from the essential attributes thereof and it is, therefore, desired that the present embodiments be considered in all respects as illustrative and not restrictive, reference being made to the appended claims, rather than to the foregoing description, and all changes which come with the meaning and range of equivalency of the claims are therefore intended to be embraced therein.

What is claimed is:

1. A solar concentrator plate having incorporated therein a dye selected from the group consisting of GF Orange-Red, Fluorol 555, oxazine-4-perchlorate, LDS 730, LDS 750, BASF 241, BASF 339, and combinations thereof with each other or with GF Clear or with 3-phenyl-fluoranthene, wherein said dye is incorporated in a thin film of glass or plastic material covering said plate and wherein each of said dyes has absorption and emission spectra, quantum efficiency and Stokes Shift as set forth in Table II herein.

2. A solar concentrator plate according to claim 1 and covered by a thin film of protecting glass.

3. A solar concentrator plate according to claim 1 covered by a thin film of protecting glass doped with $Ce^{3+}$.

4. A solar concentrator plate according to claim 1 which has incorporated therein a combination of GF Orange-Red and GF Clear dyes.

5. A solar concentrator plate according to claim 1 which has incorporated therein a combination of GF Orange-Red and Fluorol 555 dyes.

6. A solar concentrator plate according to claim 1 which has incorporated therein a combination of GF Orange-Red and oxazine-4-perchlorate dyes.

7. A solar concentrator plate according to claim 1 which has incorporated therein a combination of GF Orange-Red and LDS 730 dyes.

8. A solar concentrator plate according to claim 1 which has incorporated therein a combination of GF Orange-Red and LDS 750 dyes.

9. A solar concentrator plate according to claim 1 which has incorporated therein GF Orange-Red dye.

10. A luminescent solar collector for high efficiency conversion of solar energy to electrical energy wherein solar energy is converted to fluorescent radiation at longer wave lengths at which photovoltaic cells have a better efficiency, comprising a solar concentrator plate having lateral edges, said plate having incorporated therein a dye selected from the group consisting of GF Orange-Red, Fluorol 555, oxazine-4-perchlorate, LDS 730, LDS 750, BASF 241, BASF 339, and combinations thereof with each other or with GF Clear or with 3-phenyl-fluoranthene, said dye being incorporated in a thin film of glass or plastic material covering said plate, and each of said dyes having absorption and emission spectra, quantum efficiency and Stokes Shift as set forth in Table II herein, and said plate further being provided at least at one of its lateral edges with a photovoltaic cell having a high efficiency in the region of the spectrum of the respective fluorescent radiation.

* * * * *